(12) United States Patent
Hara

(10) Patent No.: US 7,325,404 B2
(45) Date of Patent: Feb. 5, 2008

(54) EXPOSURE APPARATUS

(75) Inventor: Shinichi Hara, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 402 days.

(21) Appl. No.: 10/819,796

(22) Filed: Apr. 7, 2004

(65) Prior Publication Data
US 2004/0200226 A1    Oct. 14, 2004

(30) Foreign Application Priority Data
Apr. 8, 2003    (JP)    ............... 2003-104422

(51) Int. Cl.
*F25B 21/02*    (2006.01)
*F25D 23/12*    (2006.01)

(52) U.S. Cl. ............... 62/3.2; 62/3.7; 62/259.2

(58) Field of Classification Search ............ 62/3.2, 62/259.2, 3.7, DIG. 10, 259, DIG. 1; 355/53
See application file for complete search history.

(56) References Cited

U.S. PATENT DOCUMENTS

| | | | | |
|---|---|---|---|---|
| 4,213,698 A | | 7/1980 | Firtion et al. | |
| 5,134,436 A | * | 7/1992 | Fujioka | 355/30 |
| 5,220,171 A | * | 6/1993 | Hara et al. | 250/443.1 |
| 5,593,800 A | * | 1/1997 | Fujioka et al. | 430/5 |
| 6,084,938 A | * | 7/2000 | Hara et al. | 378/34 |
| 6,577,704 B1 | * | 6/2003 | Holz | 378/44 |
| 6,706,618 B2 | * | 3/2004 | Takisawa et al. | 438/457 |
| 6,889,764 B2 | * | 5/2005 | Sada et al. | 165/263 |
| 2002/0048085 A1 | * | 4/2002 | Tsuji | 359/566 |
| 2002/0070355 A1 | * | 6/2002 | Ota | 250/492.2 |
| 2003/0035088 A1 | * | 2/2003 | Emoto | 355/53 |
| 2004/0035570 A1 | * | 2/2004 | Hara | 165/289 |

FOREIGN PATENT DOCUMENTS

| | | |
|---|---|---|
| JP | 60-15147 A | 1/1985 |
| JP | 9-92613 A | 4/1997 |
| JP | 9-306834 A | 11/1997 |

* cited by examiner

*Primary Examiner*—Mohammad M. Ali
(74) *Attorney, Agent, or Firm*—Morgan & Finnegan, LLP

(57) ABSTRACT

An exposure apparatus includes an optical system for guiding light to an object, a holding member for holding the object, a first refrigerator located near a holding side of the holding member without contacting the holding side, and a second refrigerator located near a backside of the holding member without contacting the backside.

15 Claims, 6 Drawing Sheets

EXPOSURE APPARATUS

This application claims the right of priority under 35 U.S.C. §119 based on Japanese Patent Application No. 2003-104422 filed on Apr. 8, 2003, which is hereby incorporated by reference herein in its entirety as if fully set forth herein.

BACKGROUND OF THE INVENTION

The present invention relates generally to exposure apparatuses for fabricating, for example, semiconductor devices, imaging devices, liquid crystal display devices, thin film magnetic heads, and other micro devices, and more particularly to an exposure apparatus that exposes by using EUV light (extreme ultraviolet light) or X-ray and the like.

Conventionally, reduction projection exposure with UV light have been used for lithography to manufacture fine semiconductor devices like semiconductor memories or logic circuits. The transferable minimum critical dimension in the reduction projection exposure is proportionate to a wavelength of light used for exposure, and inversely proportionate to the numerical aperture of the projection optical system. Along with recent demands for finer semiconductor devices, shorter ultraviolet light wavelengths have been proposed. As a result, reduction projection exposure apparatuses using EUV light with wavelengths of 15 to 20 nm shorter than that of the ultraviolet light were developed.

However, light absorption by materials increased remarkably in the EUV light's wave range. Therefore, a reflection-type or catoptric optical system is used when an exposure apparatus uses EUV light. Additionally, a reflection reticle (mask) is used instead of a transmission reticle to form the pattern to be transferred. The pattern is formed on a mirror by use of an absorber.

Exposure apparatuses (hereinafter "EUV exposure apparatus") using EUV light uses a multilayer mirror or an oblique incidence total reflection mirror as a reflective element. These mirrors have large light losses, so the number of mirrors used should be minimized. In cases where carbon-containing molecules, such as hydrocarbons, remains in the space where the optical element has been arranged, carbon will gradually adhere to the surface of the optical element when exposed to EUV light in the EUV exposure apparatus. This causes a problem by decreasing the reflectance of the EUV light due to absorption by the adhered carbon. The air pressure of the space where the optical element is arranged for exposure to EUV light should be less than $10^{-4}$ Pa, preferably less than $10^{-6}$ Pa to prevent carbon adhering. Therefore, the arrangements of the optical systems, such as the reflection mirror, the reticle, and wafer in the EUV exposure apparatus should be in vacuum state.

Optical elements, such as the reticle or the wafer, absorbs the EUV light (as exposure light) and turns most of the energy from the EUV light into heat in the vacuum state. For example, the reflection reticle forms circuit pattern information according to the differences between the reflected EUV light intensity on the light-reflecting portions and the light-absorbing portions. Heat generation by the EUV light's reflection reticle is large in comparison with a conventional transmission reticle when receiving illumination light (the exposure light) because of partial absorption by the reflection reticle. Moreover, heat is stored in the reticle with very little radiating into the atmosphere because the reflection reticle is located in vacuum state.

For example, Japanese patent application publication (No. 9-92613) discloses a refrigerator that cools the reflection reticle by radiation heat transfer to prevent thermal expansion of the reticle.

A reticle chuck for holding the reticle or a wafer chuck for holding the wafer (hereinafter "chuck") should hold the reticle or the wafer in the vacuum state. When in the vacuum state, methods for holding the reticle or the wafer by the chuck usually utilize electrostatic suction instead of conventional vacuum suction. The electrostatic suction applies 400V to 800V to an electrode, causing the chuck to suction the reticle or the wafer by charging the surface of the chuck. A leakage current among the electrodes running in the chuck generates heat and causes a temperature rise in the chuck. Because of their arrangement in a vacuum state, the reticle chuck and the wafer chuck hardly diffuse the heat instead heat is stored. For example, Japanese patent application publication (No. 9-306834) relevant to U.S. Pat. No. 6,084,938 discloses a structure in use with a temperature controlling medium or a Peltier device for controlling the temperature of the chuck.

In holding the device on the chuck, a device such as the reticle or the wafer cannot be flat when a particle is wedged between these devices and the chuck because the precision of the projection exposure decreases. Therefore, using a pin chuck with a smaller contact area than the device as the chuck decreases the probability of wedging the particle (see Japanese patent application publication No. 9-306834 and Japanese examined patent publication No. 60-15147 relevant to U.S. Pat. No. 4,213,698).

The chuck needs to be of high rigidity and have the ability to reform the flatness of the optical element. It also needs to be lightweight so as to be moved on a stage in scanning exposure process. Moreover, it needs to have a low coefficient of linear expansion because of the necessity to minimize deformity from heat. Because of the demands explained above, the chuck uses ceramic materials such as silicon carbide (SiC), silicon nitride (SiN), nitride aluminum (AlN) and the like.

However, the chuck used in the EUV exposure apparatus cannot use materials having an ideal low coefficient of thermal expansion because it should keep sufficient electrostatic suction force. The ceramic materials explained before have comparably low coefficients of linear expansion, with coefficient values at almost 1 to 10 ppm.

For example, under the following conditions: 0.01 degree centigrade rise in temperature caused by the leakage current, a 150 mm radius for the wafer chuck, and 3 ppm for its coefficient of linear expansion might shift the wafer's position by 4.5 nm during thermal expansion. A position shift of 4.5 nm by thermal expansion may be a problem because the demand for position accuracy of the wafer chuck in the EUV exposure apparatus is less than a few nanometers.

Object that raises its temperature by absorbing the EUV light (for example, optical elements such as the wafer or the reticle) have coefficient of linear expansion of 2 to 3 nm. So, they expand 3 to 4 nm when the temperature rises by 0.01 degree centigrade. A wafer thickness of, for example, 0.775 mm, has low rigidity. However, friction suctions between the wafer and the chuck surface restricts thermal expansion. So, the actual allowance in temperature rise can be up to about 0.1 degree centigrade.

The reticle consists mainly of glass ceramic and has a low coefficient of linear expansion of 50 ppb. The wafer is exchanged every 30 to 200 seconds and the reticle is exchanged with every scores of wafer exposed. Therefore, the reticle's temperature rise is more than the wafer because it receives more radiation heat transfer. For example, a temperature rise of 1 degree centigrade in the reticle causes a problem with a thermal expansion of approximately 5 nm.

Temperatures of optical elements such as the wafer, the reticle, or the chuck are raised by the heat from the leakage current and/or absorption of EUV light. Further temperature rises comes from their arrangement in vacuum state, which causes the objects to store heat with hardly any heat radiating into the atmosphere. The heat expansion of the optical elements, such as the wafer and the chuck, due to the temperature rise makes transfer of the circuit pattern in exposure imprecise. Thus, the optical element and the chuck need to be cooled in the exposure apparatus.

As the optical element and the chuck are arranged in vacuum state, it is difficult to apply a cooling method using heat transfer by convection in the EUV exposure apparatus. A direct cooling method for cooling the optical element and the chuck directly and use of a coolant seems to be preferable.

However, a precision stage such as the wafer stage for supporting the wafer chuck or the reticle stage for supporting the reticle chuck is supported by an elastic element with low rigidity (for example, a spring). Therefore, with the flow of liquid coolant in the optical element or the chuck, the position of the wafer or the reticle becomes unstable because of vibrations caused by the swirls and/or pulsations generated in the flow paths or pipes. Because the pipe, which is connected to the optical element or the chuck, restricts movement of the precision stage; the position detection and position control responses to the precision stage using an interferometer decreases, and the control for lowering high frequency vibration becomes difficult.

The heat of the optical element and the chuck are hardly transferred between each other via the atmosphere because they are arranged in vacuum state. So, the heat of the optical element and the chuck are mainly exchanged (transferred) with each other via their contact surface. In cases where a pin chuck is used, heat transfer between the pin chuck and the optical element is difficult because the contact area of the pin and the optical element is small. Therefore, there is an optical element cooling problem on the one hand and using the chuck to cool effectively on the other. The problem will be more serious if the contact area of the pin and the optical element is 10% or smaller than the area of the optical element.

Heat generation in a substrate of the optical element or the chuck fluctuates in accordance with the change in suction time of the chuck or intensity of the exposure light when exposing, for example, resists having different sensitivity. Impartial cooling of heat generated in the circuit board of the optical element or the chuck causes fluctuation in heat expansion despite a decrease in the heat, resulting in precise positioning difficulties of the optical elements, such as the wafer or the reticle.

It seems preferable to detect the temperatures of the optical elements, such as the wafer or the reticle and the chuck, to control their temperatures. Temperature detection of the chuck should be more precise than that of the optical element because the temperature rise of the chuck is smaller than that of the optical element. The temperature detection of the optical element should not be affected by the exchangeability of the optical element because of its frequent exchange.

BRIEF SUMMARY OF THE INVENTION

Accordingly, it is an exemplary object to provide an exposure apparatus with excellent throughput and optical performance, which can cool the object (for example, optical elements such as the wafer or the reticle) effectively without causing worse vibrations, position instability, and/or poor responses to position control; while reducing the fraction of defective wafers by precisely exposing the circuit pattern, and fabricating a high quality device.

Another exemplary object is to provide an exposure apparatus which can cool both the object and the object holder effectively, reduce the fraction of defective wafers by exposing the circuit pattern more precisely, and fabricate a higher quality device.

Still another exemplary object is to provide an exposure apparatus which can detect the temperature of the object surface easily and the temperature of the holding member precisely, reduce the fraction of defective wafers by exposing the circuit pattern more precisely, and fabricate a higher quality device.

An exposure apparatus of one aspect according to the present invention includes an optical system for guiding light to an object, a holding member for holding the object, a first refrigerator located near a holding side of the holding member without contacting the holding side, and a second refrigerator located near a backside of the holding member without contacting the backside.

The first or second refrigerator may cool by radiation heat transfer. The first or second refrigerator may include a radiation heat transfer plate and a Peltier device which cools the radiation heat transfer plate.

The exposure apparatus may include a sensor for detecting the temperatures of the object and a controller for controlling the temperatures of the first refrigerator in accordance with the detected temperature of the object. Preferably, the sensor detects the temperature of the object without contacting the object.

The exposure apparatus may include a sensor for detecting the temperatures of the holding member, and a controller for controlling the temperatures of the second refrigerator in accordance with the detected temperature of the holding member. Preferably, the sensor detects the temperature of the holding member while contacting the holding member.

The object may be a pattern formed reticle and the holding member may be a reticle chuck. The object may be a wafer and the holding member may be a wafer chuck.

An exposure apparatus of another aspect according to the present invention exposes an object in accordance with a pattern on a reflection reticle. The exposure apparatus includes an optical system for illuminating the reflection reticle by a light from a light source, a reticle chuck for holding the reflection reticle, and a refrigerator located near a backside of the reticle chuck without contacting the backside.

An exposure apparatus of still another aspect according to the present invention for exposing an object includes an optical system for guiding a light from a light source to the object, a chuck for holding the object, and a refrigerator located near the back of a holding side of the chuck without contacting the back of the holding side.

An exposure method of still another aspect according to the present invention includes the steps of guiding a light from a light source to an object and cooling the object and/or a holding member holding the object by radiation heat transfer from a holding side and a backside of the holding member.

A device fabrication method of still another aspect according to the present invention includes the steps of exposing an object with an exposure apparatus which comprises an optical system for guiding light to the object, a holding member for holding the object, a first refrigerator located near a holding side of the holding member without contacting the holding side, and a second refrigerator located near a backside of the holding member without contacting the backside, and developing the object that has been exposed.

Other objects and further features of the present invention will become readily apparent from the following description of the preferred embodiments with reference to the accompanying drawings.

DETAILED DESCRIPTION OF THE PREFERRED EMBODIMENTS

[The First Embodiment]

Figure 1:
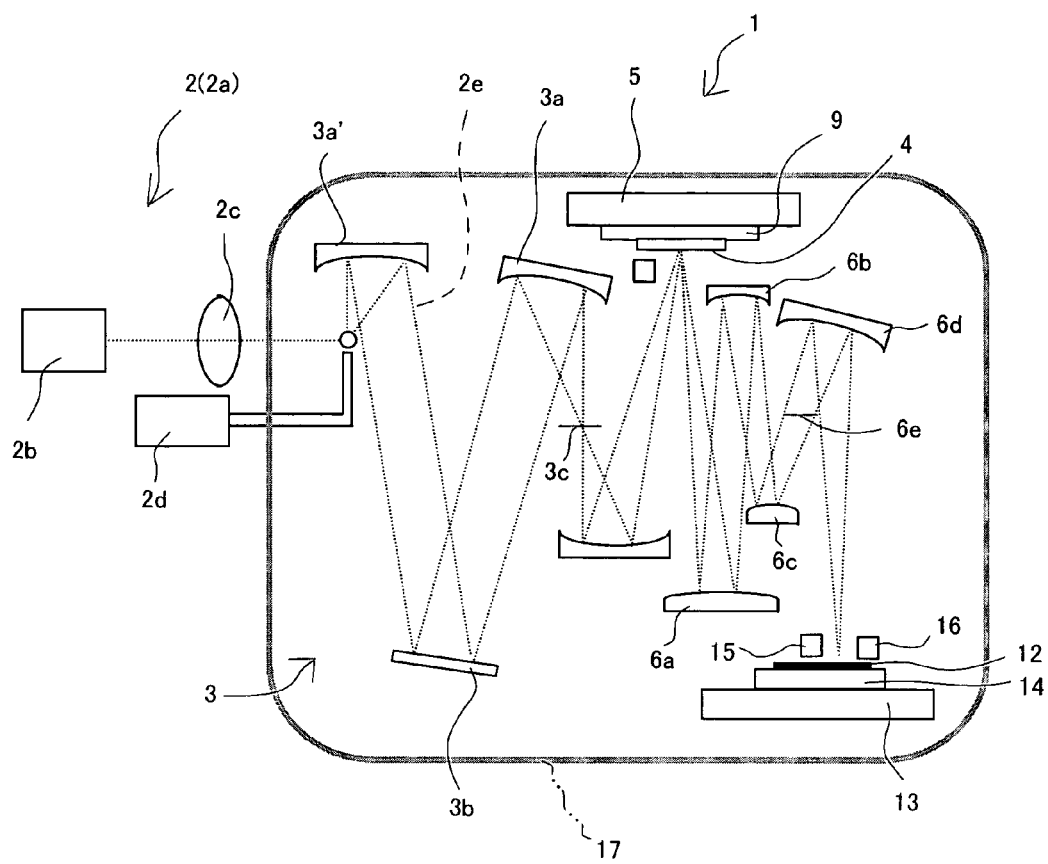
FIG. 1 is a schematic structure of the whole exposure portion in an exposure apparatus of the first embodiment according to the present invention.

Referring now to the accompanying drawings, a description will now be given of an exposure apparatus of the first embodiment according to the present invention. FIG. 1 is a schematic structure of the whole exposure portion in an exposure apparatus 1 of the first embodiment according to the present invention. The exposure apparatus 1 is a scanning type reduction projection exposure apparatus using EUV light 2e as exposure light. It includes an EUV light source 2 for emitting EUV light 2e, an illumination system 3, a reflection reticle as an object (hereinafter "reticle") 4, a reticle stage 5, a projection optical system 6, a laser interferometer for the reticle 7a and for the wafer 7b as a position measuring device (see FIG. 2), an alignment detector 15, a focus position detector 16, and a vacuum system 17.

The EUV light source uses, for example, a laser plasma light source 2a. The laser plasma light source 2a has a pulse laser 2b for excitation, a condensing lens 2c, a target feed unit 2d. The laser plasma light source 2a irradiates a highly intensified pulse laser beam from the pulse laser 2b to the target material, which is supplied by a target feed unit 2d, put in the vacuum chamber, thus generating a high-temperature plasma. EUV light 2e with a wavelength of about 13.4 nm emitted from this is utilized.

The target material, for which a metallic thin film, an inert gas, a droplet, etc. are used, is supplied into the vacuum chamber by a target feed unit 2d such as a gas jet. To raise the average intensity of the emitted EUV light 2e, repeated frequencies of the pulse laser 2b should be preferably high and is operated by the repeating the frequency at a few kHz.

The illumination system 3 for guiding EUV light 2e from the EUV light source 2 to the reticle 4 as an original form of exposure, includes a plurality of mirrors 3a and a reflection optical integrator 3b. The mirrors 3a are multilayer mirrors-or oblique incidence mirrors.

A first condensing mirror 3a' condenses the EUV light which is isotropically emitted from the EUV light source 2, and forms the EUV light in parallel. The reflection optical integrator 3b illuminates the reticle 4 uniformly by using specified numerical apertures to form a plurality of secondary light sources with the light from the mirror 3a'.

Further, an aperture 3c is arranged in a position in the illumination system 3 to be substantially conjugate with the reticle 4. It also limits the area illuminated on the reticle 4 by the EUV light 2e plane to a circular arc shape or an oblong shape. Each light from a plurality of the secondary light source formed by the reflection optical integrator 3b are concentrated at the aperture 3c by the mirror 3a.

The reticle 4 is an original form on which the circuit pattern to be projected on the wafer is formed. The reticle 4 forms a pattern to be transferred on the wafer by using an absorber on a multilayer mirror. Information from the circuit pattern is transferred depending on the reflected intensity of EUV light 2e on the light-reflecting portion and light-absorbing portion. The reticle chuck 9 as a holding member holds the reticle 4. The reticle 4 is arranged in a vacuum state with the reticle chuck 9 being an electrostatic type (electrostatic chuck). The reticle chuck 9 is provided on a reticle stage 5.

The reticle stage 5 precisely scans the reticle 4 along the sub-scanning direction (X1-direction; see FIG. 2) during exposure. It uses a precision stage which has a servo motor and a feeding mechanism or a mechanism for high precision position scanning using linear motor, etc. The reticle stage 5 also have a fine adjustment mechanism (not shown) which can finely move in the X1, Y1 (main-scanning direction), Z1 (direction perpendicular to surface of the reticle 4)-directions and rotate around each axis, and can position the reticle 4 precisely.

For positioning the reticle 4 precisely, the laser interferometer measures the position and alignment of the reticle chuck 9 and the fine adjustment mechanism moves the reticle stage 5 and the reticle chuck 9 in accordance with the results of the position measurement. However, a detailed description will be explained later.

The projection optical system 6 guides EUV light 2e reflected by the reticle 4 onto a wafer 12, using a plurality of mirrors 6a-6d and an aperture 6e. The smaller the number of the mirrors used in the projection optical system 6, the higher the efficiency of utilization of EUV light, but the more difficult the aberration control. Aberration control requires four to six mirrors with the shape of the mirrors' 6a-6d reflection surface spherical or aspherical and convex or concave.

The mirrors 6a-6d have reflection surfaces consisting of multilayer deposits of Mo/Si etc. The reflection surfaces are shaped by grinding and polishing the surface of the substrate which is made of a high rigidity, high degree of hardness, and low coefficient of thermal expansion material such as a low expansion coefficient glass or silicon carbide (SiC). Bragg's Equation described before clearly says depending on incident positions on the mirror, the differences in the light incident angle in a multilayer mirror with constant coating cycle, causes high reflectance wavelength differences in the EUV light 2e. So, the mirror is composed to have a distribution in coating cycle so as to acquire constant high reflectance wavelength of EUV light 2e on the whole mirror.

The wafer chuck 14 as a holding member provided on the wafer stage 13 holds the wafer 12 as an object, while the EUV light 2e from the reticle 4 irradiates and exposes the circuit pattern from the reticle 4 onto a surface 12a of the wafer 12. The wafer stage 13 has a mechanism for high-velocity feeding in the X2-direction (sub-scanning direction), similar to the reticle stage 5. Both the wafer stage 13 and the reticle stage 5 have scanning mechanisms for synchronized scanning in a velocity ratio proportionate to the reduction ratio in exposure projection. The wafer stage 13 has a fine adjustment mechanism (not shown) which can finely move in the X2, Y2, Z2-directions, rotate around each axis, and can position the wafer 12 precisely.

For positioning the wafer 12 precisely, the laser interferometer measures the position and alignment of the wafer stage 13, similar to the process for the reticle stage 5. The fine adjustment mechanism then moves the wafer stage 13 and the wafer chuck 14 in accordance with the results of the position measurement.

Figure 2:
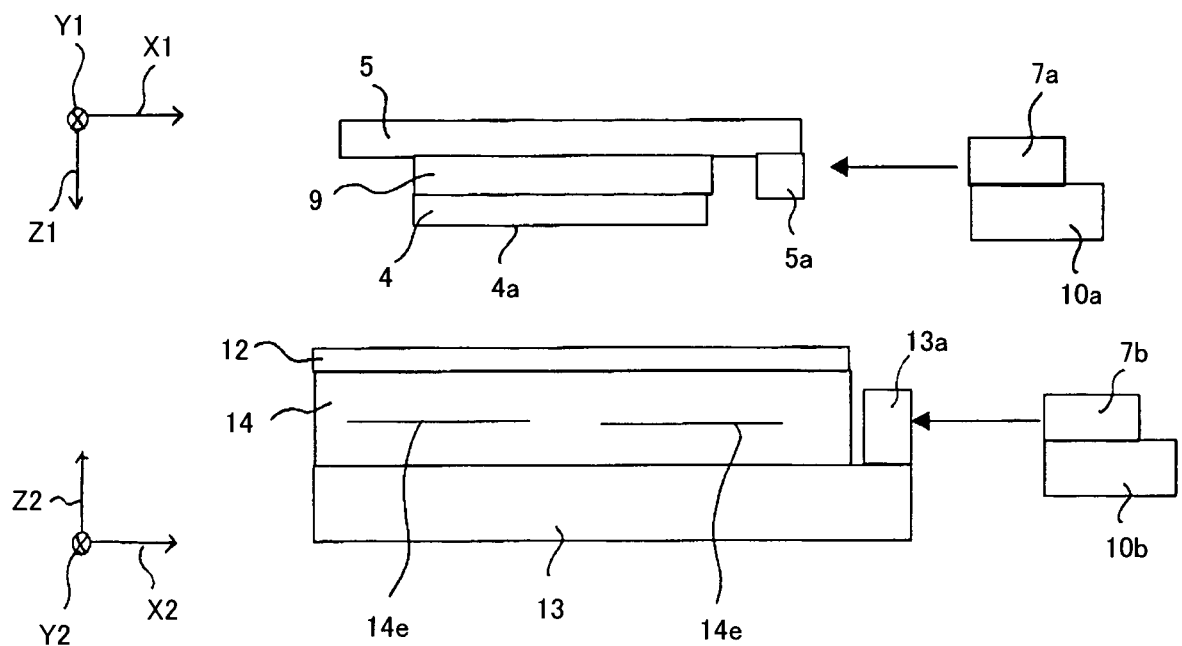
FIG. 2 is a schematic view around a reticle and a wafer in the exposure apparatus shown in FIG. 1.

Referring to FIG. 2, a description will now be given of a process for aligning the wafer 12 to the reticle 4. FIG. 2 is a schematic view around the reticle 4 and the wafer 12 in the exposure apparatus 1. To acquire the position of the reticle 4, the laser interferometer for the reticle 7a measures the position of a reticle stage mirror 5a affixed to the reticle stage 5. The laser interferometer for the reticle 7a includes, for example, a laser light source as a measurement light source and an interferometer as a detector. They are fixed to a main body of the exposure apparatus 1 with a fixing element 10a. The laser interferometer for the wafer 7b measures the position of a wafer stage mirror 13a affixed to the wafer stage 13 to acquire the position of the wafer 12. The laser interferometer for the wafer 7b includes, for example, a laser light source as a measurement light source and an interferometer as a detector. They are fixed to a main body of the exposure apparatus 1 with a fixing element 10b.

The position of the reticle 4 and the wafer 12 are adjusted so that their relative position is maintained by operating the wafer stage 13. The wafer chuck 14 uses a hyperbolic electrostatic chuck having two electrodes 14e to suction the wafer 12.

Figure 3:
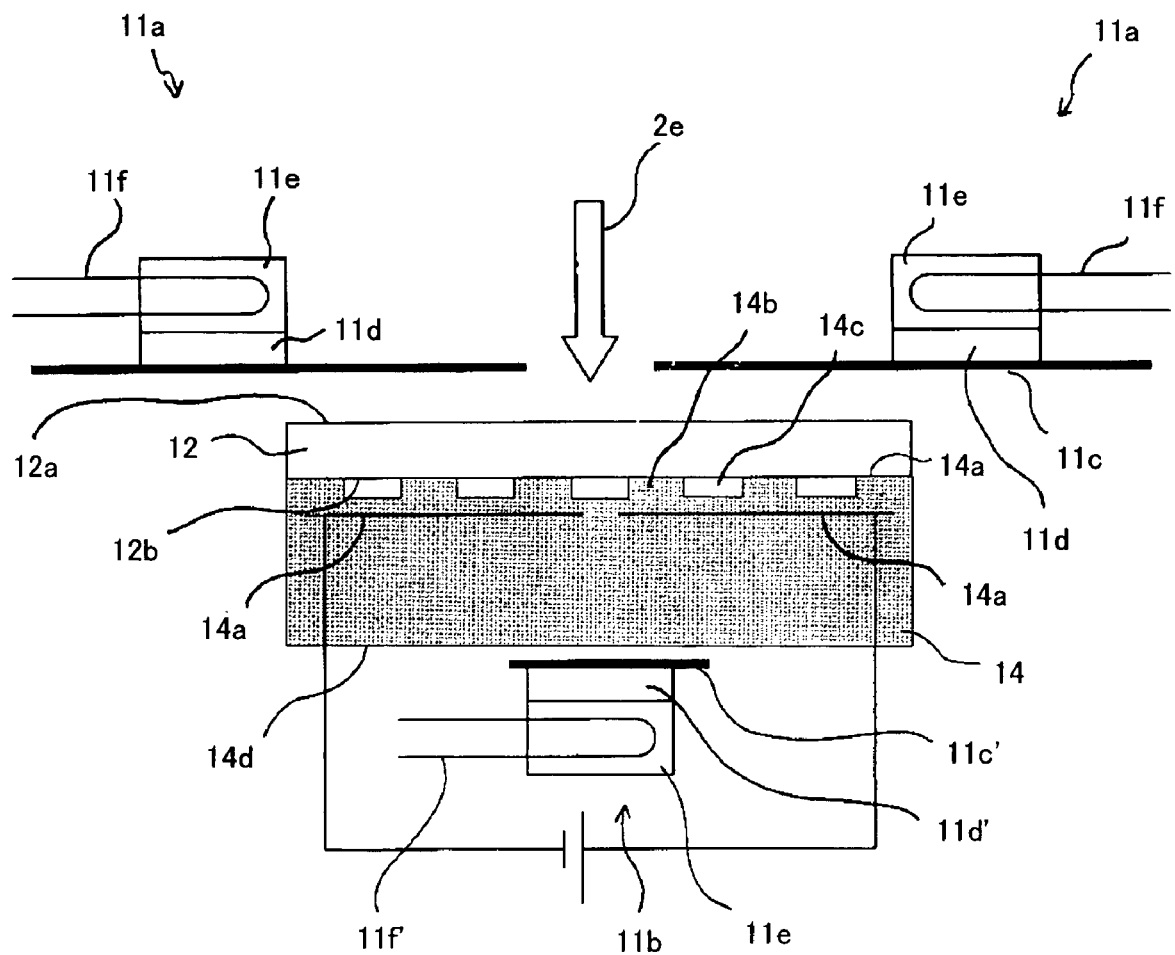
FIG. 3 is an enlarged view around the wafer and a wafer chuck in the exposure apparatus shown in FIG. 1.

FIG. 3 is an enlarged view around the wafer 12 and a wafer chuck 14 in the exposure apparatus 1. The wafer chuck 14 applies a voltage of ±500V. The wafer chuck 14 suctions the wafer 12 with an electrostatic force generated by applying a voltage between a holding surface 14a of the wafer chuck 14 and the substrate of the wafer 12. The wafer chuck 14 uses a pin chuck so as not to wedge the particle between the holding surface 14a of the wafer chuck 14 and the backside 12b of the wafer 12. The holding surface 14a has a pin 14b and a gutter 14c. The contact ratio, which is a rate of contact area with the backside 12b of the wafer 12 and the holding surface 14a divided by the whole area of the backside 12b, is no more than 10%.

A refrigerator (a first refrigerator) 11a for cooling the wafer 12 by radiation heat transfer is located near the side of the holding surface 14a of the wafer chuck 14, in the vicinity of a front surface 12a of the wafer 12 without contacting the holding surface 14a. A refrigerator (a second refrigerator) 11b for cooling the wafer chuck 14 by radiation heat transfer is located near the vicinity of a backside 14d of the wafer chuck 14 without contacting the backside 14d.

The refrigerator 11a includes a radiation heat transfer plate 11c, a Peltier device 11d, a heat radiation heat transfer block 11e, and a coolant pipe 11f. One side of the Peltier device 11d contacts the radiation heat transfer plate 11c. The radiation heat transfer plate 11c is made of materials which have a comparably high coefficient of thermal conductivity and high emissivity, for example, a ceramic such as silicon carbide (SiC). The control for the voltage applied to the Peltier device 11d can maintain the temperature of the contacting radiation heat transfer plate 11c for approximately 5 degree centigrade. Thus, the refrigerator 11a absorbs approximately 0.5W of heat from the wafer 12.

Installed on the other side of the Peltier device 11d is the heat radiation heat transfer block 11e formed with metals such as stainless steel. The heat radiation heat transfer block 11e has a flow path 11g inside. Because the flow path 11g is connected to the coolant pipe 11f, a coolant like water can be circulated from the coolant pipe 11f to the flow path 11g, allowing the coolant to cool the Peltier device 11d by absorbing heat exhausted from the Peltier device 11d. The refrigerator 11a is located at a position away from the illuminated area of EUV light 2e and the vicinity of the surface 12a of the wafer so as not to shield the surface 12a of the wafer from the incident EUV light 2e.

The refrigerator 11b includes a radiation heat transfer plate 11c', a Peltier device 11d', a heat radiation heat transfer block 11e', and a coolant pipe 11f'. One side of the Peltier device 11d' contacts the radiation heat transfer plate 11c'. The radiation heat transfer plate 11c' is made of materials which have comparably high coefficient of thermal conductivity and high emissivity, for example, a ceramic such as silicon carbide (SiC). The control for the voltage applied on the Peltier device 11d' can maintain the temperature of the contacted radiation heat transfer plate 11c' for approximately 15 degree centigrade. Thus, the refrigerator 11b absorbs approximately 0.1W of heat from the wafer chuck 14.

An alignment detector 15 detects the relative position of the reticle 4 and the optical axis of the projection optical system 6, and the relative position of the wafer 12 and the optical axis of the projection optical system 6. Depending on the results of the detection, the position and alignment of the reticle stage 5 and the wafer stage 13 are adjusted so that a projection image of the reticle 4 is projected onto a specified position on the wafer 12.

A focus position detector 16 detects a focus position on the surface 12a of the wafer in the Z2-direction (see FIG. 2) and always keeps the surface 12a of the wafer in image formation position in the projection optical system 6 during exposure, by controlling the position and the alignment of the wafer stage 13.

The exposure apparatus 1 uses an EUV light source 2 for the exposure light source. EUV light 2e, explained before, decreases its intensity due to absorption by air. Therefore, an EUV light path in this exposure apparatus 1 including the illumination optical system 3, the reticle 4, the projection optical system 6, and the wafer 12 is arranged in vacuum system 17.

A description will now be given of the operation of the exposure apparatus 1.

The exposure apparatus 1 begins the exposure process with the reticle 4 held in the reticle chuck 9 and the wafer 12 fed from a feeding system (not shown) by the wafer chuck 14. By guiding EUV light 2e from the EUV light source 2 via the illumination optical system 3 onto the surface of the reticle 4, then via the projection optical system 6 onto the surface of the wafer 12, the circuit pattern on the reticle 4 is transferred and exposed onto the wafer 12.

The exposure apparatus 1 exposes the circuit pattern through scanning. That is, the exposure apparatus 1 irradiates EUV light 2e, slit and arc shaped by the aperture 3c, onto the reticle 4 and exposes by synchronizing the scanning of the reticle stage 5 to the wafer stage 13 in the X1, X2-direction respectively, with the velocity ratio proportional to the reduction ratio of the projection optical system 6. In exposure, the alignment detector 15 adjusts the alignment of the reticle 4 and the wafer 12, the focus position detector 16 adjusts the focus position of the wafer 12, and the circuit pattern on the reticle 4 is accurately transferred onto a specified position on the wafer 12.

The wafer stage 12 moves in the X2 and Y2-directions to the beginning position of the next scanning when one exposure scanning process on the wafer 12 is finished. Then, the wafer stage 12 begins to scan in X2-direction, again synchronized to the reticle stage 5 in the X1-direction, with a velocity ratio proportional to the reduction ratio of the projection optical system 6.

Thus, the repetition of the scanning exposure, with synchronization of the reticle 4 and the wafer 12 in a reduction projection image formation state, gradually forms an image of the circuit pattern from the reticle 4 onto the wafer 12. This series of operation is called "step-and-scan". The circuit pattern is transferred onto the whole surface of the wafer 12 by step-and-scan.

The wafer 12, illuminated by EUV light 2e, absorbs EUV light 2e in the scanning exposure. Because the wafer chuck 14 is an electrostatic type in this embodiment, the wafer chuck 14 generates heat when leakage current from the applied voltage runs through the wafer chuck 14. The contact ratio of the holding surface 14a when the wafer chuck 14 is a pin chuck and the backside 12b of the wafer is no more than 10%. The gutter 14c, as a non-contact portion in a vacuum state of $10^{-6}$ Pa, occupies more than 90% of the holding surface 14a. Yet, there is still contact resistance between the pin 14b which has a contact portion of no less than 10% and the backside 12b of the wafer. Therefore, thermal resistance between the wafer 12 and the wafer chuck 14 is approximately as big as 0.1 m²degree/W. Thus, it is not enough to absorb heat from both the wafer and the wafer chuck by only cooling from the front side of the wafer or from the backside of the wafer chuck.

However, because the refrigerator 11a is located at the side of the holding surface 14a of the wafer chuck 14 in the vicinity of the surface 12a of the wafer 12 without contacting the holding surface 14a and the refrigerator 11b is located in the vicinity of the backside 14d of the wafer chuck 14 without contacting the backside 14d of the wafer chuck 14, each refrigerator cools the wafer 12 and the wafer chuck 14 by radiation heat transfer respectively. Therefore, the refrigerators are able to cool the wafer 12 and wafer chuck 14 sufficiently by absorbing their heat to reduce their thermal strain. The refrigerators 11a, 11b hardly generates vibration caused by swirl or pulsation in the flow path or the pipe when cooling and does not decrease the position stability of the wafer 12 because they do not contact the wafer 12 or the wafer chuck 14 and only cools by radiation heat transfer.

Figure 4:
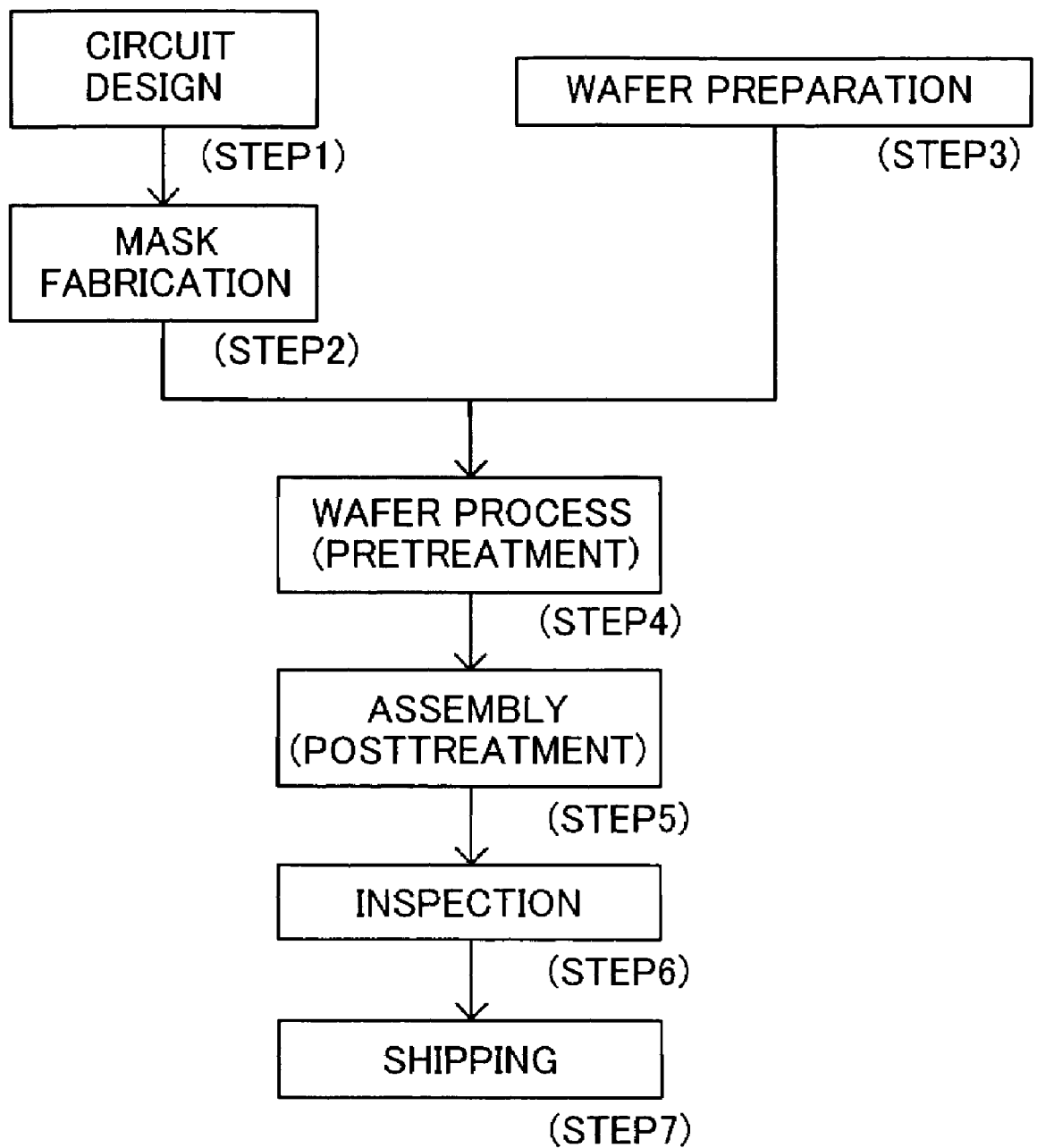
FIG. 4 is a flowchart for explaining a method for fabricating devices including an exposure process by the exposure apparatus shown in FIG. 1.
Figure 5:
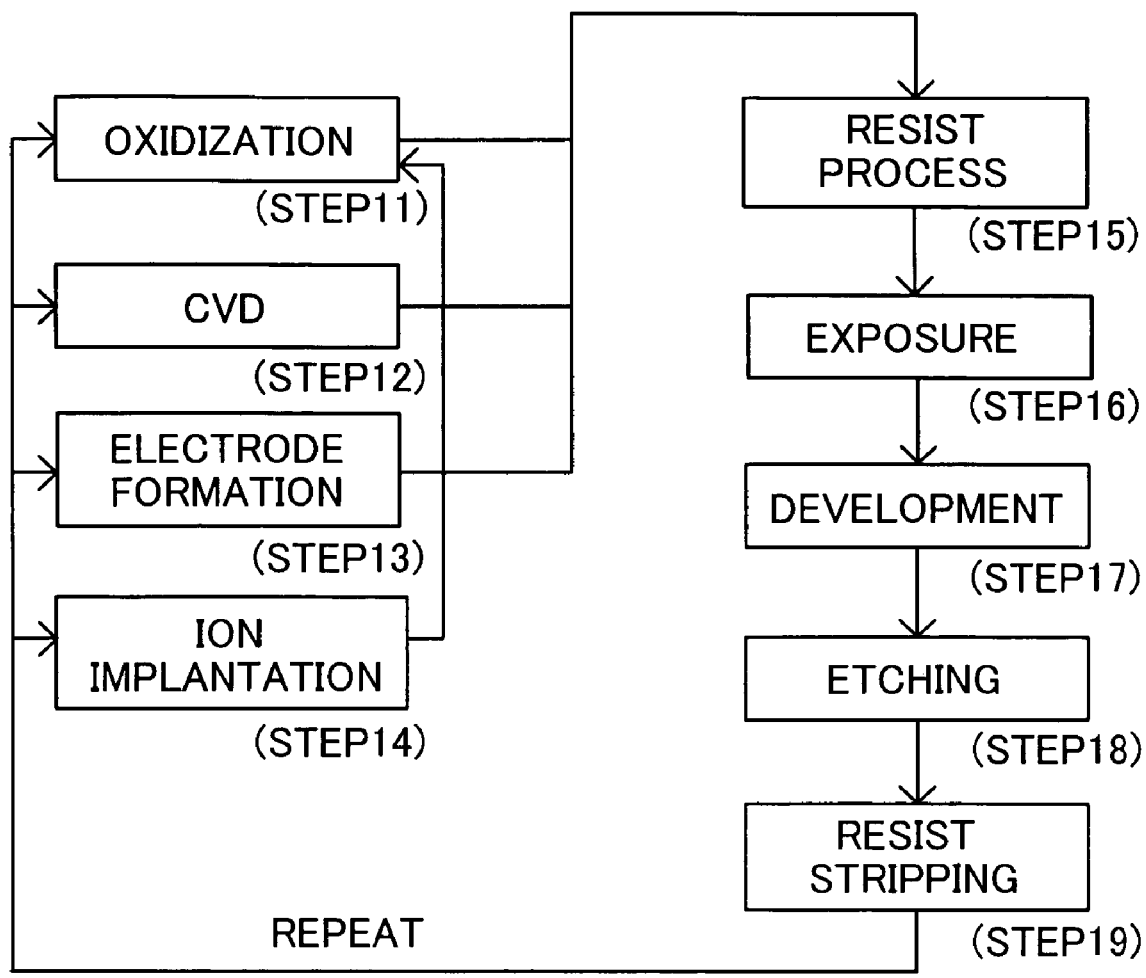
FIG. 5 is a detailed flowchart for Step 4 of the wafer process shown in FIG. 4.

Referring now to FIGS. 4 and 5, a description will be given of an embodiment of a device fabricating method using the above exposure apparatus 1. FIG. 4 is a flowchart for explaining fabrication of devices (i.e., semiconductor chips such as IC and LSI, LCDs, CCDs, etc.). Here, as an example, a description will be given of a semiconductor chip fabrication. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), referred to as a pretreatment, forms the actual circuitry on the wafer through photolithography using the mask and wafer. Step 5 (assembly), also referred to as a post treatment, forms the wafer from Step 4 into a semiconductor chip and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 5 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 100 to expose a circuit pattern on the mask onto the wafer. Step 17 (development) develops the exposed wafer. Step 18 (etching) etches parts other than a developed resist image. Step 19 (resist stripping) removes unused resist after etching. These steps are repeated to form multilayer circuit patterns on the wafer. The device fabrication method of this embodiment may manufacture higher quality devices than the conventional one.

Moreover, there are a refrigerator 11a located in the vicinity of the front surface of the wafer 12a and a refrigerator 11b located in the vicinity of the backside 14d of the wafer chuck in this embodiment. The exposure apparatus may use either or both refrigerators depending on the cooling requirements or the cost.

Further, the refrigerators 11a and 11b, are in the vicinity of, but does not contact, the wafer 12 or the wafer chuck 14 respectively. Instead of a wafer 12, the object may be a reticle 4 or a reflection mirror. That is, the refrigerator may be located in the vicinity of, but does not contact the reticle 4 and the reticle chuck 9. Or the refrigerator may be located in the vicinity of but does not contact the reflection mirror and a holding member of the mirror.

The exposure apparatus 1 uses not only EUV light as exposure light, but lights applicable for exposure like visible light, ultra violet light, X ray, or electron beam. Additionally, the exposure apparatus 1 is not limited to the step-and-scan type described in this embodiment, but is applicable to the step-and-repeat type.

[The Second Embodiment]

Figure 6:
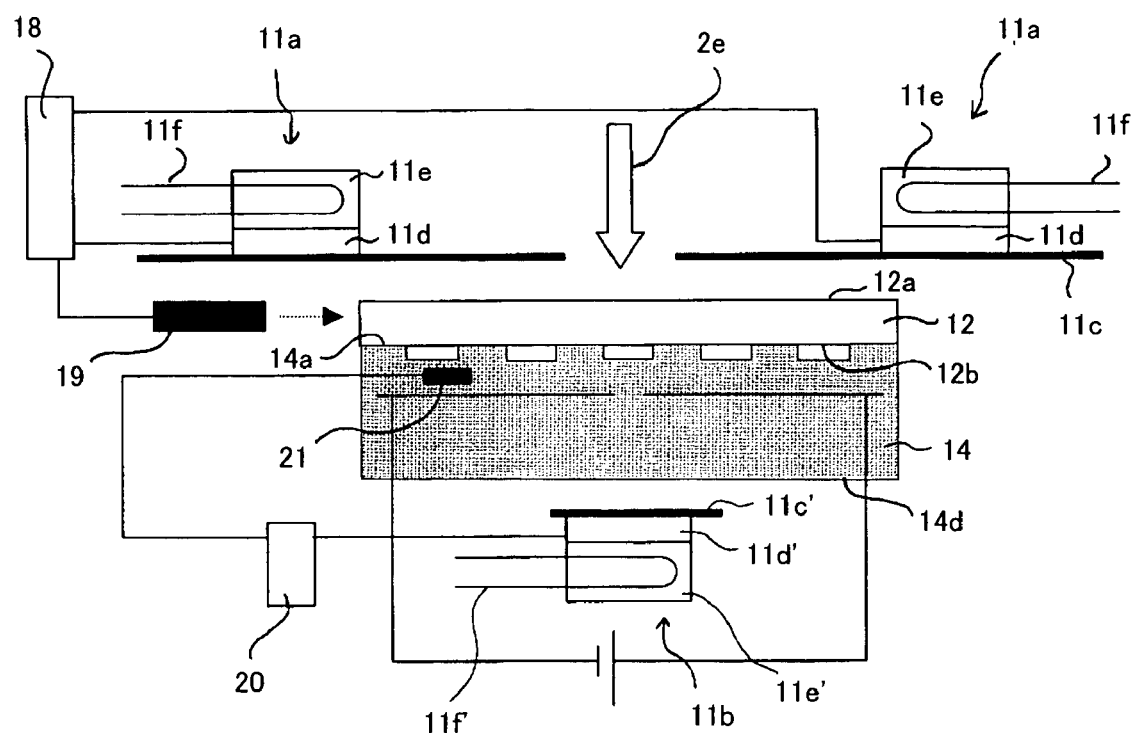
FIG. 6 is an enlarged view around a wafer and a wafer chuck in an exposure apparatus of the second embodiment according to the present invention.

Referring now to FIG. 6, a description will now be given of an exposure apparatus of the second embodiment according to the present invention. FIG. 6 is an enlarged view around the wafer 12 and a wafer chuck 14 in an exposure apparatus 1 of the second embodiment. The same structure described in the first embodiment is designated by the same reference numeral, and a description will be omitted.

A temperature controller 18 for the substrate controls the temperature of the refrigerator 11a used to control the temperature of the wafer 12. A non-contact type radiation heat transfer sensor (a first sensor) 19 connects to the temperature controller 18 for the substrate. The radiation heat transfer sensor 19 detects the surface temperature of the wafer 12 without contacting it, while the temperature controller 18 for the substrate maintains the temperature of the wafer 12 at 23 degree centigrade by adjusting the applied voltage to the Peltier device 11d of the refrigerator 11a in accordance with the temperature detection result.

A temperature controller 20 for the chuck controls the temperature of the refrigerator 11b used for controlling the temperature of the wafer chuck 14. A contact type sensor (a second sensor) 21 connects to the temperature controller 20 for the chuck. The radiation heat transfer contact type sensor 21 detects the temperature of the wafer chuck 14 by contacting a resistance temperature sensor made of platinum to the wafer chuck 14. The temperature controller 20 for the chuck maintains the temperature of the wafer chuck 14 at 23 degree centigrade by adjusting the applied voltage to the Peltier device 11d' of the refrigerator 11b in accordance with the temperature detection result.

A non-contact type sensor generally has a precision of approximately 0.05 degree centigrade, while a contact type sensor generally has a higher precision of approximately 0.001 degree centigrade. The temperature detection has enough precision in the second embodiment despite the non-contact type radiation heat transfer sensor 19 because the temperature rise of the wafer 12 is bigger than that of the wafer chuck 14. Meanwhile, the contact type sensor 21 using a platinum resistance temperature sensor can detect small temperature rises in the wafer chuck 14 with a precision of about 0.001 degree centigrade.

The exposure apparatus 1 according to the second embodiment having the structure explained before, can detect the surface temperature of the wafer 12 with ease and the temperature of the wafer chuck 14 with high precision. It can also control the temperatures of the wafer 12 and the wafer chuck 14 by controlling the temperatures of the refrigerators 11a, 11b in accordance with the temperature detection results.

The temperature stability of the wafer 12 and the wafer chuck 14 can be improved by detecting and controlling the temperatures of the wafer 12 and the wafer chuck 14 in spite of large fluctuation in exposure energy or heat generation by the wafer chuck 14. Therefore, the exposure apparatus can expose and transfer the circuit pattern more precisely, reduce the fraction of defective wafers, and fabricate a high quality device.

As explained before, the object may be a reticle, a mirror, or a reflection optical integrator instead of the wafer. Further, the present invention is not limited to these preferred embodiments, and other variations and modifications may be made without departing from the scope of the present invention.

Thus, the exposure apparatus of the present invention can effectively cool objects such as a wafer, a reticle, or a mirror without causing worse vibration, position instability, and/or poor responses to position control; while reducing the fraction of defective wafers by precisely exposing the circuit pattern, and fabricating a high quality device.

The exposure apparatus can also cool both the object and the object holder effectively, reduce the fraction of defective wafers by exposing the circuit pattern more precisely, and fabricate a higher quality device.

The exposure apparatus can also detect the temperature of the object surface with ease and the temperature of the holding member with high precision, reduce the fraction of defective wafers by exposing the circuit pattern more precisely, and fabricate a higher quality device.

Additionally, the exposure apparatus can also cool the device effectively without causing worse vibration, position instability, and/or poor responses to position control; while reducing the fraction of defective wafers by precisely exposing the circuit pattern, and fabricating a high quality device.

What is claimed:

1. An exposure apparatus comprising:
   an optical system for guiding light to an object;
   a holding member for holding the object, the holding member including a pin chuck, and a contact ratio between the holding member and the object being no more than 10%;
   a first refrigerator located near a front side of the holding member without contacting the front side of the holding member thereby cooling a front surface of the object held by the holding member; and
   a second refrigerator located near a backside of the holding member without contacting the backside of the holding member thereby cooling the backside of the object held by the holding member.

2. The exposure apparatus according to claim 1, wherein the first refrigerator cools by radiation heat transfer.

3. The exposure apparatus according to claim 1, wherein the second refrigerator cools by radiation heat transfer.

4. The exposure apparatus according to claim 1, wherein the first refrigerator comprises a radiation heat transfer plate, and a Peltier device which cools the radiation heat transfer plate.

5. The exposure apparatus according to claim 1, wherein the second refrigerator comprises a radiation heat transfer plate, and a Peltier device which cools the radiation heat transfer plate.

6. The exposure apparatus according to claim 1, further comprising:
   a sensor for detecting a temperature of the object; and
   a controller for controlling the temperatures of the first refrigerator in accordance with the detected temperature of the object.

7. The exposure apparatus according to claim 6, wherein the sensor detects the temperature of the object without contacting the object.

8. The exposure apparatus according to claim 1, further comprising:
   a sensor for detecting a temperature of the holding member; and
   a controller for controlling temperatures of the second refrigerator in accordance with the detected temperature of the holding member.

9. The exposure apparatus according to claim 8, wherein the sensor detects the temperature of the holding member by contacting the holding member.

10. The exposure apparatus according to claim 1, wherein the object is a pattern formed reticle and the holding member is a reticle chuck.

11. The exposure apparatus according to claim 1, wherein the object is a wafer and the holding member is a wafer chuck.

12. The exposure apparatus according to claim 1, wherein said object is a reflection reticle.

13. A device fabrication method comprising the steps of:
   exposing an object using an exposure apparatus; and
   developing the object exposed,
   wherein said exposure apparatus includes:
   an optical system for guiding light to the object;
   a holding member for holding the object, the holding member including a pin chuck, and a contact ratio between the holding member and the object being no more than 10%;
   a first refrigerator located near a front side of the holding member without contacting the front side of the holding member thereby cooling a front surface of the object held by the holding member; and a second refrigerator located near a backside of the holding member without contacting the backside of the holding member thereby cooling the backside of the object held by the holding member.

14. An exposure apparatus comprising:
   an optical system for guiding light to an object,
   a holding member for holding the object,
   a first refrigerator located near a front side of the holding member without contacting the front side of the holding member thereby cooling a front surface of the object held by the holding member; and
   a second refrigerator located near a backside of the holding member without contacting the backside of the holding member thereby cooling the backside of the object held by the holding member,
   wherein each of said first refrigerator and said second refrigerator is configured in such a way that the temperature of said first refrigerator is substantially lower than that of said second refrigerator.

15. A device fabrication method comprising:
   exposing an object using an exposure apparatus; and
   developing the object exposed,
   wherein said exposure apparatus comprises:
   an optical system for guiding light to the object;
   a first refrigerator located near a front side of the holding member without contacting the front side of the holding member thereby cooling a front surface of the object held by the holding member; and
   a second refrigerator located near a backside of the holding member without contacting the backside of the holding member thereby cooling the backside of the object held by the holding member,
   wherein each of said first refrigerator and said second refrigerator is configured in such a way that the temperature of said first refrigerator is substantially lower than that of said second refrigerator.

* * * * *